United States Patent
Sugita et al.

(10) Patent No.: US 6,998,303 B2
(45) Date of Patent: Feb. 14, 2006

(54) MANUFACTURE METHOD FOR SEMICONDUCTOR DEVICE WITH PATTERNED FILM OF ZRO₂ OR THE LIKE

(75) Inventors: Yoshihiro Sugita, Kawasaki (JP); Yusuke Morisaki, Kawasaki (JP); Kiyoshi Irino, Kawasaki (JP); Shiqin Xiao, Kawasaki (JP); Takayuki Ohba, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/633,534

(22) Filed: Aug. 5, 2003

(65) Prior Publication Data

US 2004/0038555 A1    Feb. 26, 2004

(30) Foreign Application Priority Data

Aug. 8, 2002 (JP) ............................. 2002-231786

(51) Int. Cl.
*H01L 21/76* (2006.01)

(52) U.S. Cl. .................. 438/199; 438/511; 438/520; 438/722

(58) Field of Classification Search ........ 438/197–200, 438/231, 232, 301, 303, 306, 520, 528, 689, 438/722, 142, 510, 511, 514, 518, 519, 542, 438/555

See application file for complete search history.

(56) References Cited

U.S. PATENT DOCUMENTS

| | | | | |
|---|---|---|---|---|
| 6,150,221 A | * | 11/2000 | Aoyama | 438/300 |
| 6,573,197 B1 | * | 6/2003 | Callegari et al. | 438/791 |
| 6,579,767 B1 | * | 6/2003 | Park et al. | 438/287 |
| 6,686,248 B1 | * | 2/2004 | Yu | 438/303 |
| 2001/0023120 A1 | * | 9/2001 | Tsunashima et al. | 438/585 |
| 2004/0002223 A1 | * | 1/2004 | Nallan et al. | 438/710 |

* cited by examiner

*Primary Examiner*—Brook Kebede
(74) *Attorney, Agent, or Firm*—Westerman, Hattori, Daniels & Adrian, LLP

(57) ABSTRACT

An insulating film made of zirconia or hafnia is formed on the surface of a semiconductor substrate. A partial surface area of the insulating film is covered with a mask pattern. By using the mask pattern as a mask, ions are implanted into a region of the insulating film not covered with the mask pattern to give damages to the insulating film. By using the mask pattern as a mask, a portion of the insulating film is etched.

4 Claims, 6 Drawing Sheets

FIG.2

| ETCHANT | TEMP. | AMORPHOUS ZrO$_2$ | CRYSTAL ZrO$_2$ | AMORPHOUS HfO$_2$ | CRYSTAL HfO$_2$ |
|---|---|---|---|---|---|
| H$_2$SO$_4$ : H$_2$O$_2$ = 4:1 | 150°C | 0.1 | 0.03 | 2 | 0.01 |
| H$_2$SO$_4$ : H$_2$O$_2$ = 4:1 | 130°C | 0.03 | HARDLY SOLUBLE | 0.7 | HARDLY SOLUBLE |
| H$_3$PO$_4$ (conc.) | 150°C | 0.2 | 0.04 | 32 | 0.01 |
| HCl : H$_2$O$_2$ : H$_2$O = 1:2:10 | 80°C | HARDLY SOLUBLE | HARDLY SOLUBLE | HARDLY SOLUBLE | HARDLY SOLUBLE |
| NH$_4$OH : H$_2$O$_2$ : H$_2$O = 1:2:10 | 80°C | 0.01 | HARDLY SOLUBLE | 0.1 | HARDLY SOLUBLE |
| HF : H$_2$O = 1:100 | ROOM TEMP. | BELOW 0.1 | HARDLY SOLUBLE | 5.6 | HARDLY SOLUBLE |
| HF : H$_2$O = 3:100 | ROOM TEMP. | 0.1 | HARDLY SOLUBLE | 18 | HARDLY SOLUBLE |
| HF : H$_2$O = 1:10 | ROOM TEMP. | 0.5 | 0.007 | 47 | 0.003 |

FIG.5

| SAMPLE NO. | PLASMA | PLASMA TREATMENT TIME | SULFLIC ACID TREATMENT TIME | Hf REMAINING AMOUNT (%) |
|---|---|---|---|---|
| 1 | NH₃ | 30sec | 135°C | BELOW DETECTION LIMIT |
| 2 | NH₃ | 30sec | 170°C | BELOW DETECTION LIMIT |
| 3 | Ar | 10sec | 135°C | 6.17 |
| 4 | Ar | 10sec | 170°C | BELOW DETECTION LIMIT |
| 5 | Ar | 30sec | 135°C | 0.26 |
| 6 | Ar | 30sec | 170°C | 0.07 |
| 7 | N₂ | 30sec | 135°C | BELOW DETECTION LIMIT |
| 8 | N₂ | 30sec | 170°C | BELOW DETECTION LIMIT |
| 9 | NONE | — | 135°C | 16.6 |
| 10 | NONE | — | 170°C | 17.0 |

MANUFACTURE METHOD FOR SEMICONDUCTOR DEVICE WITH PATTERNED FILM OF ZRO₂ OR THE LIKE

CROSS REFERENCE TO RELATED APPLICATION

This application is based on Japanese Patent Application No. 2002-231786 filed on Aug. 8, 2002, the entire contents of which are incorporated herein by reference.

BACKGROUND OF THE INVENTION

A) Field of the Invention

The present invention relates to a semiconductor device manufacture method, and more particularly to a semiconductor device manufacture method in which an insulating film having a high dielectric constant such as zirconia ($ZrO_2$) and hafnia ($HfO_2$) is formed on a semiconductor substrate and partially etched.

B) Description of the Related Art

Zirconia and hafnia have a dielectric constant higher than silicon oxide and have been paid attention as the material of a gate insulating film of next generation MISFETs. In manufacturing MISFET, the gate insulating film left on the surfaces of source and drain regions is required to be removed in order to form metal silicide films on the surfaces of the source and drain regions.

Since zirconia and hafnia are chemically stable to a large degree, it is difficult to etch it by a wet process. It is also difficult for reactive ion etching (RIE) to have a high etch selection relative to both silicon oxide of an element separation region and silicon of a substrate and a gate electrode.

SUMMARY OF THE INVENTION

An object of this invention is to provide a semiconductor device manufacture method in which an insulating film made of zirconia or hafnia is etched by a wet process.

According to one aspect of the present invention, there is provided a semiconductor device manufacture method comprising steps of: (a1) forming an insulating film made of zirconia or hafnia over a surface of a semiconductor substrate; (a2) covering a partial surface area of the insulating film with a mask pattern; (a3) by using the mask pattern as a mask, implanting ions into a region of the insulating film not covered with the mask pattern to give damages to the insulating film; and (a4) by using the mask pattern as a mask, etching a portion of the insulating film.

According to another aspect of the invention, there is provided a semiconductor device manufacture method comprising steps of: forming an insulating film made of zirconia or hafnia over a surface of a semiconductor substrate; forming a gate electrode on a partial surface area of the insulating film; by using the gate electrode as a mask, implanting ions into a region of the insulating film not covered with the gate electrode to give damages to the insulating film; by using the gate electrode as a mask, etching a portion of the gate insulating film; and by using the gate electrode as a mask, implanting impurity ions into a surface layer of the semiconductor substrate on both sides of the gate electrode.

The insulating film may be transformed to an amorphous state by a method different from ion implantation into the insulating film. Instead of implanting ions, the insulating film may be exposed to nitrogen plasma, argon plasma or ammonia plasma.

The insulating film made of zirconia or hafnia can be transformed to an amorphous state by implanting ions into the insulating film. Zirconia or hafnia transformed to the amorphous state can be etched more easily than the crystal state. By exposing the insulating film made of zirconia or hafnia to nitrogen plasma, argon plasma or ammonia plasma, the insulating film can be etched easily.

BRIEF DESCRIPTION OF THE DRAWINGS

FIG. 2 is a table showing etching speeds of zirconia films and hafnia films.

FIG. 5 is a table showing remaining amounts of Hf after hafnia films with and without a plasma process are removed.

DESCRIPTION OF THE PREFERRED EMBODIMENTS

By referring to FIGS. 1A to 1G, a semiconductor device manufacture method according to a first embodiment of the invention will be described.

Figure 1A:
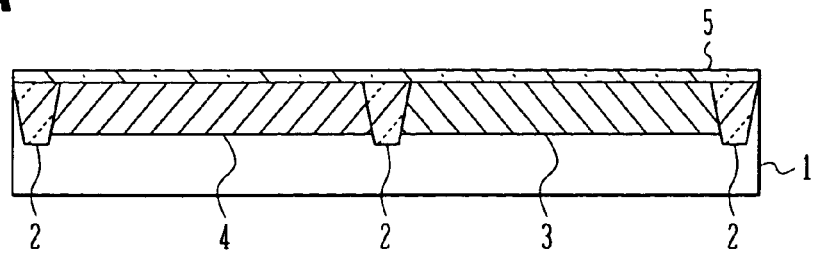
FIGS. 1A to 1G are cross sectional views of a substrate illustrating a semiconductor device manufacture method according to a first embodiment of the invention.

As shown in FIG. 1A, in and on the surface layer of a semiconductor substrate 1 made of silicon, an element separation insulating region 2 is formed by shallow trench isolation (STI). The element separation insulating region 2 defines active regions in which p-channel and n-channel MISFETs are to be formed. In the active region where a p-channel MISFET is to be formed, phosphorous (P) ions are implanted to form an n-type well 3. In the active region where an n-channel MISFET is to be formed, boron (B) ions are implanted to form a p-type well 4.

A gate insulating film 5 of zirconia or hafnia is deposited on the surface of the substrate to a thickness of 1 to 5 nm. In order to improve the characteristics of an interface between the semiconductor substrate 1 and gate insulating film 5, a silicon oxide film or silicon oxynitride film having a thickness of 0.5 to 1.5 nm may be formed between the zirconia or hafnia film and the semiconductor substrate 1.

The zirconia or hafnia film can be formed by chemical vapor deposition (CVD), metal organic CVD (MOCVD), atomic layer CVD (ALCVD) or sputtering. If CVD or ALCVD is used, $ZrCl_4$ can be used as zirconium source material, and $HfCl_4$ can be used as hafnium source material. If MOCVD is used, the zirconium source material may be tetra-tertiary-butoxyzirconium ($Zr(t-OC_4H_9)_4$), tetrakis-diethylaminozirconium ($(Zr[N(C_2H_5)_2]_4)$, tetrakis-dimethylaminozirconium ($Zr[N(CH_3)_2]_4$) or the like, and the hafnium source material may be tetra-tertiary-butoxyhafnium ($Hf(t-OC_4H_9)_4$), tetrakis-diethylaminohafnium ($(Hf[N(C_2H_5)_2]_4)$, tetrakis-dimethylaminohafnium ($Hf[N(CH_3)_2]_4$) or the like.

Figure 1B:
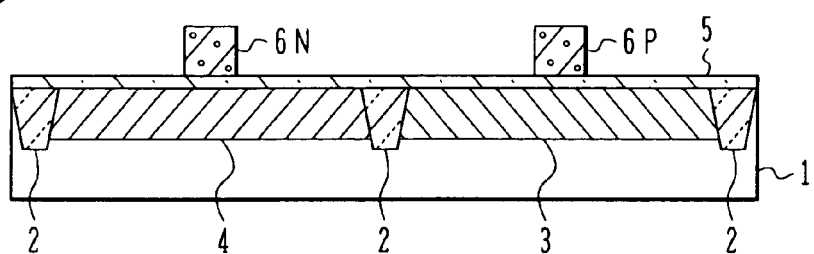

The processes up to the state shown in FIG. 1B will be described. A polysilicon film is deposited on the gate insulating film 5 to a thickness of 40 to 120 nm. In order to suppress the diffusion of boron, a silicon nitride film or silicon oxynitride film having a thickness of 0.5 to 1 nm may be formed between the gate insulating film 5 and polysilicon film.

The polysilicon film is patterned by reactive ion etching (RIE) using chlorine-containing gas to leave an n-channel MISFET gate electrode 6N and a p-channel MISFET gate electrode 6P respectively made of polysilicon. The gate insulating film 5 is exposed in the region other than the regions where the gate electrodes are disposed.

Figure 1C:
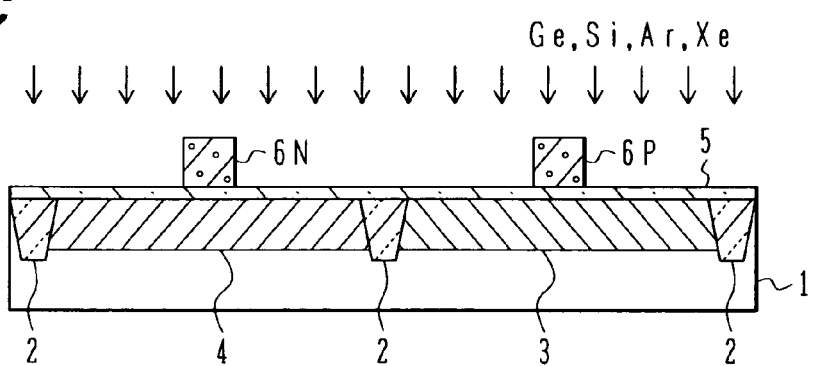

As shown in FIG. 1C, by using the gate electrodes 6P and 6N as a mask, germanium (Ge) ions, silicon (Si) ions, argon (Ar) ions or xenon (Xe) ions are implanted into the gate insulating film. With this ion implantation, the gate insulating film 5 in the region not covered with the gate electrodes 6P and 6N are damaged and transformed to an amorphous state. In order to transform the gate insulating film having a thickness of 1 to 5 nm to the amorphous state, it is preferable to perform the ion implantation under the conditions of a dose of $1 \times 10^{14}$ to $1 \times 10^{16}$ cm$^{-2}$ (a general condition of $1 \times 10^{15}$ cm$^{-2}$) and an acceleration energy of 0.5 to 40 keV. Instead of Ge, Si, Ar or Xe, other element ions may be implanted which do not generate carriers in silicon.

Figure 1D:
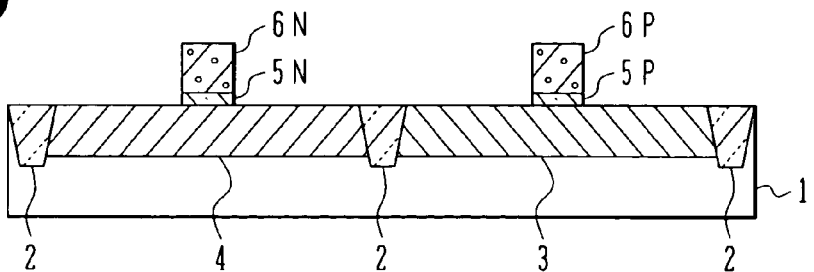

As shown in FIG. 1D, the exposed gate insulating film 5 is removed to leave gate insulating films 5P and 5N under the gate electrodes 6P and 6N. The gate insulating film 5 can be etched by hot concentrated sulfuric acid at a temperature of 110 to 180° C., mixture liquid of sulfuric acid and hydrogen peroxide at a temperature of 110 to 150° C., hot concentrated phosphoric acid at a temperature of 130 to 180° C. or diluted hydrofluoric acid at a density of 0.5 to 50 wt. %. Among these materials, since diluted hydrofluoric acid dissolves silicon oxide, the reliability of the element isolation insulating region 2 is lowered. Since hot concentrated phosphoric acid dissolves silicon, the surface of the semiconductor substrate 1 becomes rough and the shape of the gate electrode is deformed. It is therefore preferable to use hot concentrated sulfuric acid or mixture liquid of sulfuric acid and hydrogen peroxide.

Since the mixture liquid of sulfuric acid and hydrogen peroxide has been used in silicon processes, matching with conventional processes can be retained. The typical composition is a sulfuric acid density of 80 to 98 wt. % and a hydrogen peroxide density of 1 to 20 wt. %, a typical process temperature is 110 to 140° C. and a process time is 1 to 30 minutes.

Figure 1E:
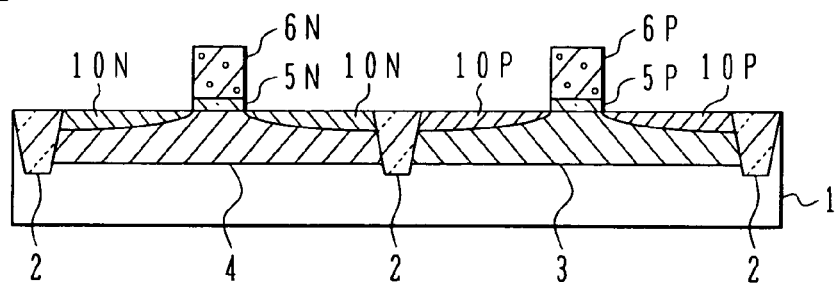

As shown in FIG. 1E, boron ions are implanted into the region where a p-channel MISFET is to be formed, by using the gate electrode 6P as a mask, to thereby form extension regions 10P of the source and drain regions having a lightly doped drain (LDD) structure. Phosphorous ions are implanted into the region where an n-channel MISFET is to be formed, by using the gate electrode 6N as a mask, to form extension regions 10N.

Figure 1F:
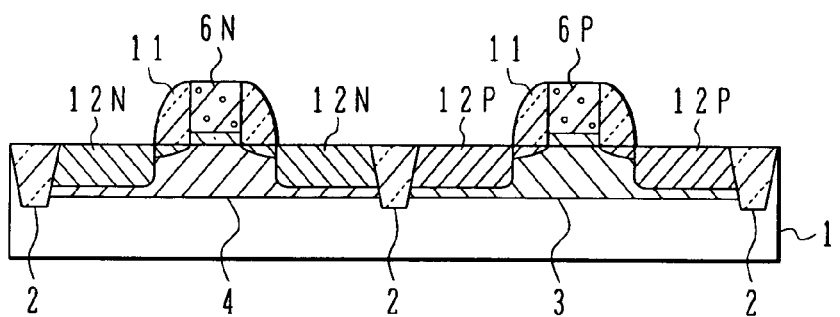

As shown in FIG. 1F, side wall spacers 11 of silicon oxide are formed on the side walls of the gate electrodes 6N and 6P. The side wall spacer 11 is made through deposition of a silicon oxide film and anisotropic etching.

Arsenic (As) ions are implanted into the region where an n-channel MISFET is to be formed, by using the gate electrode 6N and side wall spacers 11 as a mask, to form source and drain regions 12N. Boron ions are implanted into the region where a p-channel MISFET is to be formed, by using the gate electrode 6P and side wall spacers 11 as a mask, to form source and drain regions 12P.

Figure 1G:
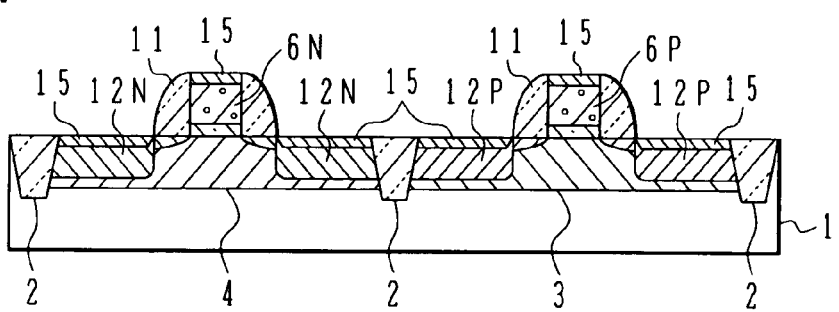

As shown in FIG. 1G, a cobalt silicide film 15 is formed on the source and drain regions 12N and 12P and on the upper surfaces of the gate electrodes 6N and 6P. The cobalt silicide film 15 is formed by a well-known self alignment silicide method (salicide method).

In the first embodiment described above, in the process shown in FIG. 1C, ions are implanted into the gate insulating film 5 to transform it to an amorphous state. The exposed gate insulating film 5 can be easily etched in the process shown in FIG. 1D.

By referring to FIG. 2, the etching speed of zirconia and hafnia will be described. Amorphous $ZrO_2$ and amorphous $HfO_2$ shown in FIG. 2 indicate amorphous zirconia and amorphous hafnia formed through ion implantation of the first embodiment, crystal $ZrO_2$ indicates monoclinic and quadratic zirconia, and crystal $HfO_2$ indicates monoclinic hafnia. A ratio of each solution described in the etchant column indicates a weight ratio. Sulfuric acid, hydrogen peroxide, hydrochloric acid, ammonium hydroxide, and hydrofluoric acid used are 98 wt. %, 31 wt. %, 36 wt. %, 29 wt. %, and 50 wt. %, respectively. Each value shown in the table of FIG. 2 indicates an etching speed in the unit of "nm/min".

It can be known that when mixture liquid of sulfuric acid and hydrogen peroxide, hot concentrated phosphoric acid, or diluted fluoric acid is used as an etchant for zirconia or hafnia, transforming zirconia or hafnia to an amorphous state makes etching speed enough high.

Figure 3:
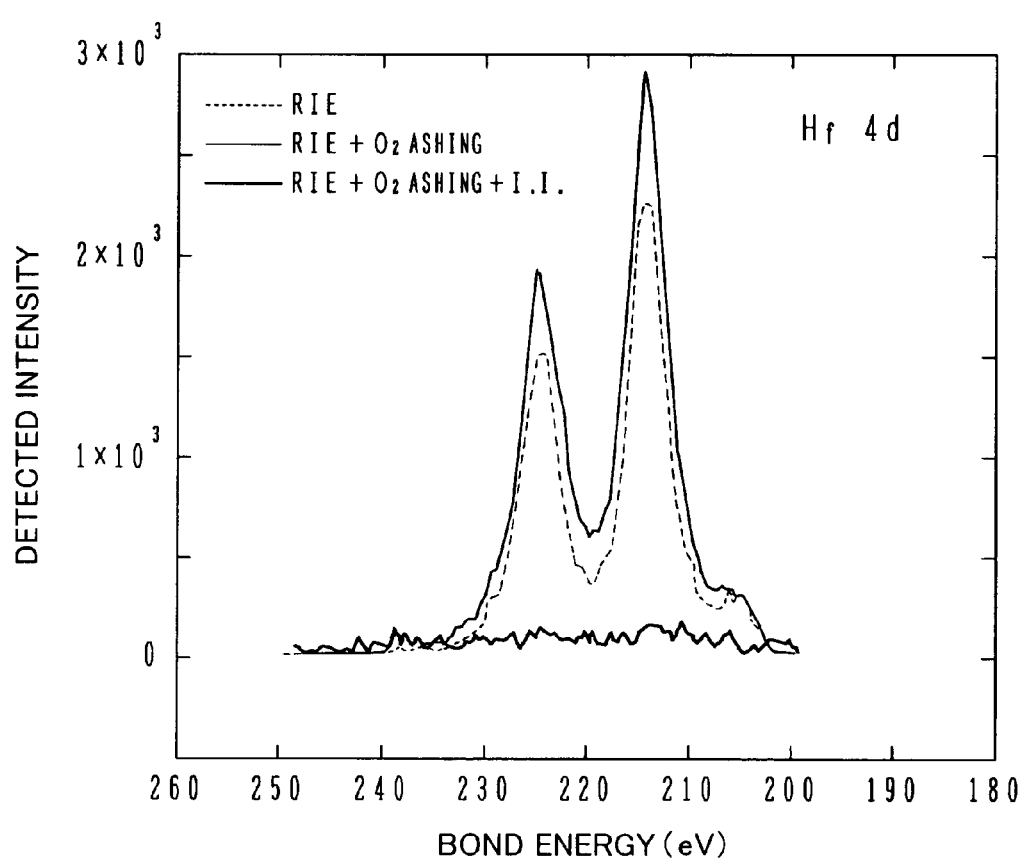
FIG. 3 is a graph showing the XPS analysis results of sample surfaces after hafnia films are etched.

FIG. 3 shows the results of analysis by an X-ray photoelectron spectroscopy (XPS) of the surfaces of sample hafnia films having a thickness of 4 nm etched by mixture liquid of sulfuric acid and hydrogen peroxide. Peaks shown in FIG. 3 correspond to electrons on the orbit 4d of Hf. The abscissa represents a bond energy in the unit of "eV" and the ordinate represents a photoelectron detection intensity in an arbitrary unit.

A broken line indicates the detection result after a hafnia film exposed in an RIE atmosphere using chlorine-containing gas was etched by a wet process. A thin line indicates the detection result after a hafnia film exposed in an RIE atmosphere and then exposed in an oxygen plasma was etched by a wet process. A bold line indicates the detection result after a hafnia film exposed in an RIE atmosphere and oxygen plasma and implanted with arsenic ions under a dose condition of $1 \times 10^{15}$ cm$^{-2}$ was etched by a wet process. It can be understood that the hafnia film is almost completely removed only when the hafnia film is transformed to an amorphous state through ion implantation.

If the ion implantation for changing the film to an amorphous state shown in FIG. 1C is performed obliquely relative to the substrate surface, damages can be applied only to the gate insulating film 5 without damages in the semiconductor substrate 1. In this case, it is preferable to set the incidence angle of an ion beam (angle between the implantation direction of the ion beam and the normal to the substrate surface) to 80° or larger. In order to prevent damages of the gate films 5 under the gate electrodes 6N and 6P, it is preferable to set the inclination direction of an ion beam in parallel to the direction along which the gate electrodes 6N and 6P extend (a direction perpendicular to the drawing sheet of FIG. 1C).

If the ion implantation is performed under the condition that implanted ions remain in the gate insulating film 5 and do not reach the surface of the semiconductor substrate 1, ions of carbon, nitrogen, oxygen, fluorine or the like may be implanted to transform the gate insulating film 5 to the amorphous state.

As the incidence angle of an ion beam is made small (e.g., 10° or smaller), the surface layer of the semiconductor substrate 1 is also damaged and transformed to the amorphous state. If the surface layer of the semiconductor substrate 1 is transformed to the amorphous state, the channeling phenomenon can be prevented during the ion implantation for the extension regions and source drain regions.

If the surface layer of the semiconductor substrate 1 is not desired to be damaged, the incidence angle of an ion beam is made large, whereas if the channeling phenomenon is desired to be prevented, the incidence angle is made small.

Next, by referring to FIGS. 4A to 4D, a semiconductor device manufacture method according to a second embodiment will be described.

Figure 4A:
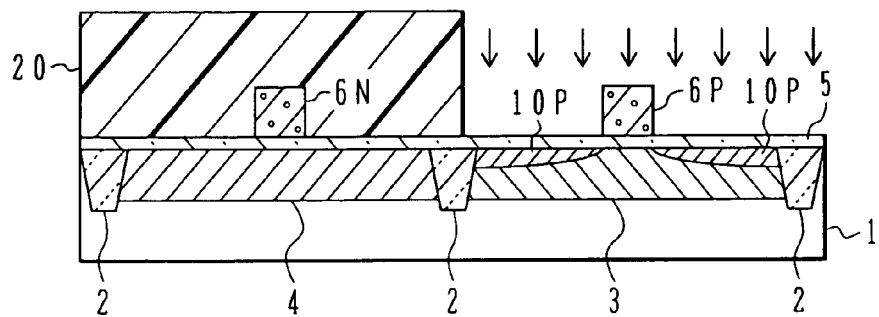
FIGS. 4A to 4D are cross sectional views of a substrate illustrating a semiconductor device manufacture method according to a second embodiment of the invention.

The processes up to the state shown in FIG. 4A will be described. The processes of forming an element separation insulating region 2, an n-type well 3, a p-type well 4, a gate insulating film 5 and gate electrodes 6P and 6N are similar to those of the first embodiment described with reference to FIGS. 1A and 1B.

A region where an n-channel MISFET is to be formed is covered with a resist pattern 20. By using the resist pattern 20 and gate electrode 6P as a mask, boron ions are implanted into the surface layer of the semiconductor substrate 1 to form extension regions 10P. During this ion implantation, the gate insulating film 5 irradiated with an ion beam is damaged and transformed to the amorphous state. In order to obtain a sufficient amorphous state, it is preferable to set the boron dose to $1\times10^{14}$ cm$^{-2}$.

Figure 4B:
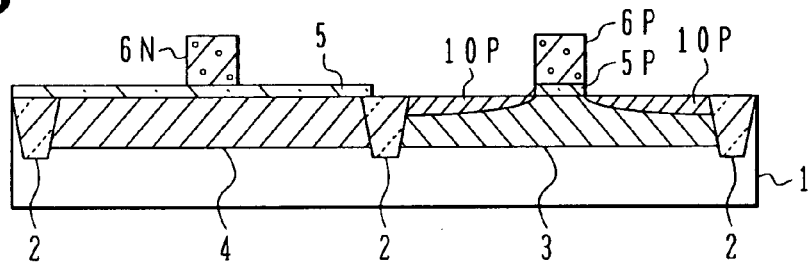

As shown in FIG. 4B, a region of the gate insulating film 5 transformed to the amorphous state is etched. This etching can be performed by an etching method similar to the method of etching the gate insulating film 5 of the first embodiment shown in FIG. 1D. After the gate insulating film 5 is etched, the resist pattern 20 is removed.

Figure 4C:
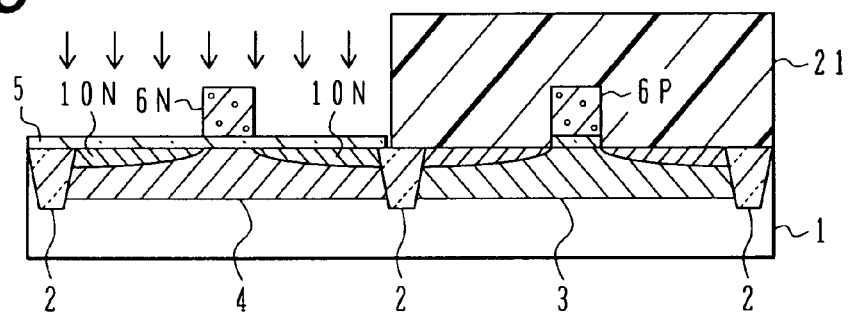

As shown in FIG. 4C, a region where a p-channel MISFET is to be formed is covered with a resist pattern 21. By using the resist pattern 21 and gate electrode 6N as a mask, phosphorous ions are implanted into the surface layer of the semiconductor substrate 1 to form extension regions 10N. The dose of phosphorous ions is the same as that of boron ions for forming the extension regions 10P of the p-channel MISFET. During this ion implantation, the gate insulating film 5 irradiated with an ion beam is damaged and transformed to the amorphous state.

Figure 4D:
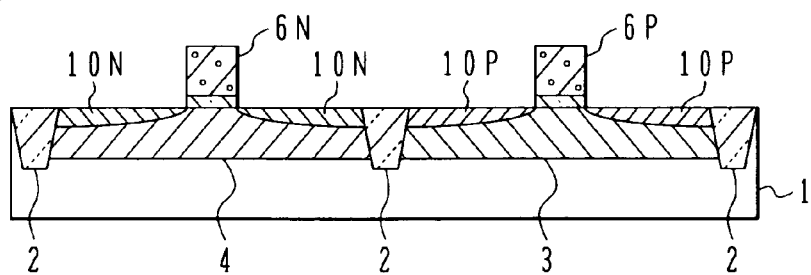

As shown in FIG. 4D, a region of the gate insulating film 5 transformed to the amorphous state is etched. Thereafter, the resist pattern 21 is removed. With the processes similar to those shown in FIGS. 1F and 1G, an n-channel MISFET and a p-channel MISFET are manufactured.

In the second embodiment, the gate insulating film 5 of zirconia or hafnia is transformed to the amorphous state when the ion implantation for the extension regions 10P and 10N are performed. The gate insulating film 5 transformed to the amorphous state can therefore be easily removed.

In the second embodiment, ion implantation for the extension regions 10P and 10N is performed through the gate insulating film 5. In some cases, oxygen atoms or the like in the gate insulating film 5 are knocked on and transported to the semiconductor substrate 1. If the junction of the extension region becomes shallow, transport of oxygen atoms or the like by the knock-on phenomenon cannot be neglected. In order to form a shallow junction, the first embodiment method is more suitable.

Next, a semiconductor device manufacture method according to a third embodiment will be described. In the first embodiment, the gate insulating film 5 is transformed to the amorphous state by implanting germanium ions or the like in the process shown in FIG. 1C. In the third embodiment, the gate insulating film 5 is decomposed in the state shown in FIG. 1C by exposing the gate insulating film 5 to plasma of argon (Ar), nitrogen ($N_2$) or ammonium ($NH_3$) by using the gate electrodes 6P and 6N as a mask. The decomposed gate insulating film 5 can be easily removed by using sulfuric acid or the like, similar to the first embodiment.

By referring to FIG. 5, the etching characteristics of hafnia films exposed to plasma will be described. Samples 1 to 14 shown in FIG. 5 were prepared. Each sample was formed by forming a silicon oxide film having a thickness of 1 nm on the surface of a silicon substrate and forming a hafnia film having a thickness 5 nm on the silicon oxide film. The hafnia film of each sample was formed at a growth temperature of 300° C. by using HfCl$_4$ and H$_2$O as source gas. A sulfuric acid process time was 30 minutes for every sample. The Hf remaining amount is represented in the unit of "atom %" analyzed by XPS.

In the samples 9 to 12 subjected to a nitrogen plasma process and then immersed in sulfuric acid, it can be understood that Hf was not detected and the hafnia film was almost completely removed. In the samples 1 to 8 exposed to ammonia plasma or argon plasma and then immersed in sulfuric acid, it can be understood that the Hf remaining amount is smaller than the samples 13 and 14 not subjected to the plasma process. By exposing the hafnia film to plasma, the hafnia film can be easily removed by etching using sulfuric acid.

In the third embodiment, although the hafnia film is exposed to nitrogen plasma, argon plasma or ammonia plasma, it may be exposed to different plasma capable of decomposing the hafnia film so as to be easily etched. Examples of such plasma are plasma of Kr, Xe, $O_2$ or the like.

It can be expected that a zirconia film can be etched easily by exposing it to plasma, similar to the hafnia film.

The present invention has been described in connection with the preferred embodiments. The invention is not limited only to the above embodiments. It is apparent that various modifications, improvements, combinations, and the like can be made by those skilled in the art.

What is claimed is:

1. A semiconductor device manufacture method comprising the sequential steps of: (c1) forming an insulating film made of zirconia or hafnia over a surface of a semiconductor substrate; (c2) covering a partial surface area of the insulating film with a mask pattern; (c3) by using the mask pattern as a mask, exposing a region of the insulating film not covered with the mask pattern pro one plasma selected from a group consisting of nitrogen plasma, argon plasma and ammonia plasma to amorphize the insulating film not covered with the mask; and (c4) following said step of exposing a region of the insulating film not covered with the mask pattern to one plasma selected from a group consisting of nitrogen plasma, argon plasma and ammonia plasma, and by using the mask pattern as a mask, etching a portion of the amorphized insulating film.

2. A semiconductor device manufacture method according to claim 1, wherein the step (c4) etches the insulating film by using one etchant selected from a group consisting of sulfuric acid, mixture liquid of sulfuric acid and hydrogen peroxide, fluoric acid and phosphorous acid.

3. A semiconductor device manufacture method comprising the sequential steps of: forming an insulating film made of zirconia or hafnia over a surface of a semiconductor substrate; forming a gate electrode on a partial surface area of the insulating film; by using the gate electrode as a mask, exposing a region of the insulating film not covered with the gate electrode to one plasma selected from a group consisting of nitrogen plasma, argon plasma and ammonia plasma; amorphize the insulating film not covered with the gate electrode; following said step of exposing a region of the insulating film not covered with the gate electrode to one plasma selected from a group consisting of nitrogen plasma, argon plasma and ammonia plasma, and by using the gate electrode as a mask, etching a portion of the amorphized insulating film; and by using the gate electrode as a mask, implanting impurity ions into a surface layer of the semiconductor substrate on both sides of the gate electrode.

4. A semiconductor device manufacture method comprising steps of:

forming an insulating film made of zirconia or hafnia over a surface of a semiconductor substrate;

covering a partial surface area of the insulating film with a mask pattern;

by using the mask pattern as a mask, implanting ions into a region of the insulating film not covered with the mask pattern to transform the region of the insulating film not covered with the mask pattern to an amorphous state; and following said step of implanting ions into a region of the insulating film not covered with the mask pattern to transform the region to an amorphous state, and by using the mask pattern as a mask, etching a portion of the insulating film by using mixture liquid of sulfuric acid and hydrogen peroxide.

* * * * *